United States Patent [19]
Okamoto et al.

[11] Patent Number: 5,616,173
[45] Date of Patent: Apr. 1, 1997

[54] THICK FILM CONDUCTOR PASTE FOR AUTOMOTIVE GLASS

[75] Inventors: Kuninori Okamoto; Hideaki Kuno; Isamu Yaguchi; Jun Koishikawa, all of Kanagawa; Yasuo Yamamoto, Tokyo, all of Japan

[73] Assignee: E. I. du Pont de Nemours and Company, Wilmington, Del.

[21] Appl. No.: 544,356

[22] Filed: Oct. 17, 1995

[51] Int. Cl.$^6$ ............................................. H01B 1/14
[52] U.S. Cl. ................................... 106/117; 252/514
[58] Field of Search ......................... 106/1.19; 252/514

[56] References Cited

U.S. PATENT DOCUMENTS

| | | | |
|---|---|---|---|
| 3,775,154 | 11/1973 | Grego et al. | 117/38 |
| 3,844,796 | 10/1974 | Jasinski | 106/52 |
| 3,929,674 | 12/1975 | Patterson | 252/514 |
| 4,011,087 | 3/1977 | Short | 106/1.13 |
| 4,371,459 | 2/1983 | Nazarenko | 106/1.19 |
| 4,446,059 | 5/1984 | Eustice | 252/514 |
| 4,552,691 | 11/1985 | Shoji et al. | 106/1.18 |
| 4,623,389 | 11/1986 | Donley et al. | 106/1.14 |
| 4,636,254 | 1/1987 | Husson, Jr. et al. | 106/1.19 |
| 4,859,214 | 8/1989 | Grungy | 106/1.19 |
| 5,302,557 | 4/1994 | Carroll et al. | 501/19 |
| 5,346,651 | 9/1994 | Oprosky et al. | 252/514 |
| 5,378,408 | 1/1995 | Carroll et al. | 106/1.19 |

OTHER PUBLICATIONS

International Journal for Hybrid Microelectronics, vol. 10, No. 4, 1987 Silver Spring MD US, pp. 20–24, H.Z. Wu et al., "Densification and Adhesion of Silver Thick Film Conductors", p. 20 (no month available).

Database WPI, Section Ch, Week 8212, Derwent Publications Ltd. London, GB; Class G02, An 82–23020E & JP-A-57 027 506 (Central Glass KK), 13 Feb. 1982, Abstract.

Primary Examiner—Helene Klemenski

[57] ABSTRACT

A thick film paste composition used to apply a conductive pattern, comprising (a) spherical, non-coagulating fine particles of metallic silver having a surface area/weight ratio of at least 1.1 m$^2$/g and having a particle size of 1.0 μm or less, and (b) fine particles of a glass frit having a softening point of 350° to 620° C. and contained in an amount of 2.1 weight parts or less per 100 weight parts of metallic silver, wherein (a) and (b) are dispersed in (c) an organic medium.

2 Claims, 1 Drawing Sheet

THICK FILM CONDUCTOR PASTE FOR AUTOMOTIVE GLASS

FIELD OF THE INVENTION

The present invention in general relates to a thick film conductor paste, and in particular to a thick film conductor composition that is used to prevent the fogging of the windows in an automobile.

BACKGROUND OF THE INVENTION

In recent years the automobile manufacturing industry has been offering an optional window accessory with which frost and/or condensation can be removed using an electrically conductive grid that is permanently installed in the window. For rapid defrosting, it must be possible to supply a large amount of power, such as 12 volts, from a low voltage power source to the circuits. Furthermore, the wires of the conductive grid must be thin enough that they will not block the visibility out the rear window.

The resistance of the conductive pattern needs to be on the order of 2 to 30 milliohms per square, and this requirement is easily met by a noble metal conductor, and particularly silver. Silver is the most widely used conductor substance in this application at the present time.

Almost all of the substances used up to now in the manufacture of grids for removing window condensation contain a thick film silver conductor, which is manufactured from a paste composed of fine silver particles and a glass frit dispersed in an organic medium. In a typical application, a paste containing 70 wt % silver powder, 5 wt % glass frit, and 25 wt % organic medium is screen printed through a 180 standard mesh screen onto a rear window made of flat, unmolded glass. The printed composition is dried for at least two minutes at approximately 150° C., and the entire element is then fired for two to five minutes in air at 650° C. After this firing, the softened glass is compressed into a mold and molded, then rapidly cooled and annealed. During the firing cycle, the organic medium is removed by evaporation and pyrolysis. The glass and the silver are sintered, with the glass acting as a binder for the silver particles, and this forms a continuous conductive path.

As shown in FIG. 1, the automobile window defogger requires a wide surface area (about 1 cm wide by 50 cm long) portion called a bus bar 3 that is used to bond electrode terminals to the grid 2 positioned over the rear window 1 of the automobile. A black glass paste called enamel is printed between the glass sheet and the silver so that the bus bar portion 3 cannot be seen from outside the automobile. In this case, since the enamel and the silver paste are fired at the same time, the glass in the enamel rises to the surface of the silver, where it creates problems of poor terminal soldering or poor adhesive strength. Methods that have been adopted in the past to deal with these problems including printing twice in order to make part of the silver thick film thicker, and printing only the terminal bonding portion with enamel, but the drawbacks to these methods were that they increased the number of steps in the process or increased the amount of silver used.

The present invention offers a thick film conductive paste that has high adhesive strength and good terminal solderability in simultaneous firing with the enamel, even if the thick film of the silver paste is made thicker.

SUMMARY OF INVENTION

The present invention relates to a thick film paste composition used to apply a conductive pattern, which is composed of (a) non-coagulating fine particles of metallic silver having a surface area/weight ratio of at least 1.1 m$^2$/g and having a particle size of 1.0 μm or less, and (b) fine particles of a glass frit having a softening point of 350° to 620° C. and contained in an amount of 2.1 weight parts or less per 100 weight parts of metallic silver, wherein (a) and (b) are dispersed in (c) an organic medium.

Figure 1:
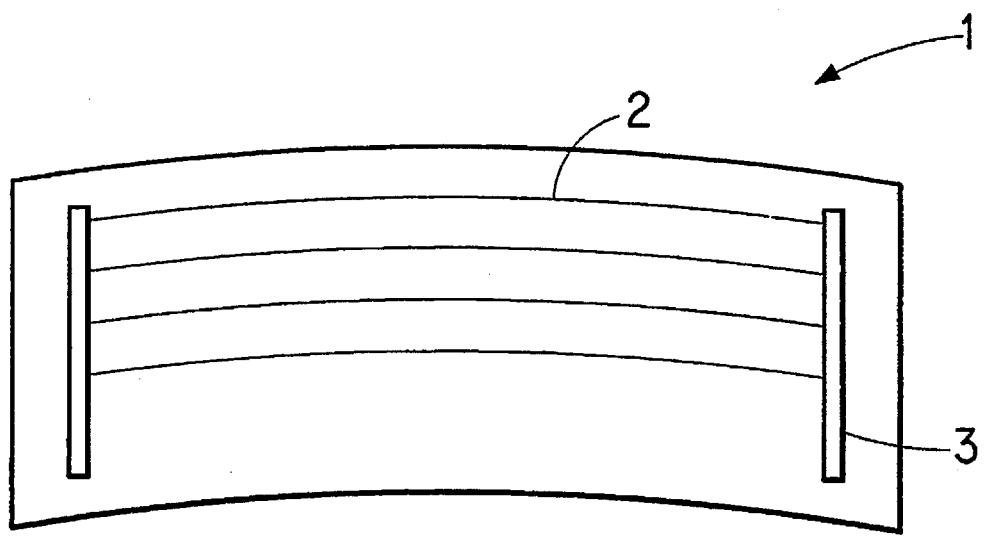
FIG. 1 illustrates a common conductive grid formed using a thick film conductor paste positioned on the rear window of an automobile, and the bus bar that is used to bond the electrode terminals of this grid.

Key: 1 automobile rear window, 2 conductive grid, 3 bus bar used to bond electrode terminals.

DETAILED DESCRIPTION OF THE INVENTION

A. Conductive metal

Silver powder is used as the conductive metal in the present invention, and this silver powder is used in the form of a spherical powder. This spherical powder must be in a state in which it is not coagulated so as to achieve a high film density after firing. The critical pigment volume concentration (CPVC) is a measure of the degree of this coagulation. This value is calculated from the amount of oil absorption as defined in ASTM D281-31, and is a substitute characteristic that indicates the size of the void between the powder particles. The higher the value, the smaller is the void between the powder particles. This CPVC should be at least 56% in the present invention.

Because of its shape, a flake powder sometimes has a CPVC of 56% or higher, but there are problems with sinterability, so such a powder cannot be used in the present invention.

From the standpoint of the technological effect, the particle diameter of the silver does not itself need to be narrowly limited in the present invention. However, the particle size affects the sintering characteristics of the silver, with large particles sintering more slowly than small particles. Furthermore, the silver particles must be of a size that is suited to the applied method (usually screen printing). Consequently, the size of the particles of silver in the present invention must not exceed one micron. This in turn requires that the surface area/weight ratio be at least 1.1 m$^2$/g. It is preferred that the particle size be 1.0 μm or less.

The amount of silver in the composition is usually 60 to 99 wt % based on solids and excluding the liquid organic medium.

B. Inorganic binder

Since a thick film paste that has been screen printed onto a glass substrate is fired at 580° to 680° C., the organic medium is volatilized from the thick film paste, and the silver particles are subjected to liquid phase sintering, the inorganic binder in the composition of the present invention is a glass frit with a softening point of 350° to 620° C. so that the composition will be suitably sintered, wetted, and bonded to the glass substrate when fired at 580° to 620° C.

As long as the transition metal oxide is contained in the glass, the chemical composition of the glass frit binder is not important in terms of the function of the present invention. Lead borosilicate is widely used in glass pastes for automobiles, and it can also be used in the implementation of the present invention. Lead silicate and lead borosilicate glass are excellent in terms of both their softening point range and their glass adhesion. Low-borate glass, i.e., glass whose $B_2O_3$ content does not exceed approximately 20 wt %, is preferable. This low-borate glass often contains small amounts of other glass forming agents and improvers such 60 to 80% PbO.

The total amount of inorganic binder in the composition is usually 1 to 20 wt %, and preferably 1 to 10 wt %, of the solid portion of the composition. In the present invention, the range in which the desired adhesive strength on the glass substrate and on the enamel can be obtained is 0.87 to 2.1 weight parts [of binder] per 100 weight parts of metallic silver.

As used herein, the term "softening point" is the softening point obtained by the fiber elongation method discussed in ASTM C338-57.

C. Organic medium

The metal composition of the present invention is usually formed into a paste that can be printed in the desired circuit pattern.

Any suitable inert liquid can be used as the organic medium (carrier), but a nonaqueous inert liquid is preferable. Any of a variety of organic liquids can be used, with or without a thickener, stabilizer, and/or other standard additives. Examples of organic liquids that can be used include alcohols, esters of these alcohols, such as an acetate or propionate, a terpene, such as pine oil or terpineol, a solution of a resin, such as polymethacrylate, a solution of ethyl cellulose in a solvent, such as pine oil, and a monobutyl ether of ethylene glycol monoacetate. The medium can contain a volatile liquid, which will promote high-speed setting after printing onto the substrate.

A favorable organic medium is composed of ethyl cellulose in terpineol (9 to 1 ratio) and based on a combination of a thickener blended with butylcarbitol acetate. The paste is conveniently manufactured with a triple-roll kneader. The preferable viscosity of these compositions is approximately 30 to 100 PaS, which is measured at 10 rpm and 25° C. using a #5 spindle with a Brookfield HBT viscosimeter. The amount of thickener used will depend on the viscosity ultimately desired for the composition. Specifically, it will depend on the required printing conditions of the system. Usually, the organic medium will probably make up to 5 to 50 wt % of the paste.

D. Coloring agent

An important criterion in the manufacture of an antifogget for an automobile is the color at the interface between the glass and the conductor pattern. The most effective type of glass used in the manufacture of automobile windows is soda lime glass, which is manufactured by float glass method, does not need to be ground or polished, is nearly perfectly flat, and has excellent uniformity in its thickness. With the float glass method, a small amount of tin is diffused in glass from a bath. This leaves no visible image on the surface of the glass. However, the diffusion of tin creates different chemical interactions with the glass that are accompanied by the coloration of metals such as silver and copper, and the surface of the glass becomes harder.

When silver is used as the conductive substance, a natural, dark brown color will be produced at the glass-conductor interface, without any coloring agent being added, after the conductor has been printed on the "tin side" of the glass, i.e., the side of the glass printed following the tin in the float glass method.

With this manufacturing method, it is best to print the conductor over the air side of the glass in order to avoid difficulty in operation. For example, this results in less loss of yield from mechanical damage to the glass surface, and the color of the enamel can be controlled better. However, when the conductor is printed on the "air side" of the glass, i.e., the side exposed to the atmosphere, there is only a little coloration. Because of this, the usual practice in the automobile glass industry is to print a border of enamel on the glass, and then print the silver paste on the tin side of the float glass. As a result, the ingredients of the thick film paste intended for this use include various coloring agents, and these produce suitable coloring and allow printing on the air side of the glass.

Examples of the coloring agents used in the composition of the present invention include glass (such as glass that contains manganese), metal resinates, boron, and boride compounds. These coloring agents exhibit different effects on the properties of the fired conductive paste. Specifically, admixing rhodium or $B_2O_3$ in the desired proportion produces an advantageous effect in the control of the resistance value after the firing of the conductive paste. Since the properties of the fired paste thus vary, the coloring additives should be suitably selected and used in the desired amount so as to maintain the proper balance between the color, resistance, and soldering characteristics of the fired paste.

E. Sample manufacture

A small-scale anti-fogging circuit was manufactured using the following method for the sake of evaluation in the practical examples.

1. Either a solvent-based or UV-setting type of decorative enamel paste is screen printed over a flat glass substrate using an ordinary screen, typically 156 or 195 mesh polyester.

2. The printed enamel pattern is dried for 15 minutes at 150° C. or UV set at 1.2 $J/cm^2$, depending on the type of enamel.

3. A silver paste is screen printed over the unfired enamel or over the tin side or the air side of the flat glass substrate using an ordinary screen, typically 195 mesh polyester.

4. The silver is fired, or the silver and the enamel are simultaneously fired, in a belt furnace in which the peak glass surface temperature reaches 580° to 680° C.

F. Test methods

Resistance: The resistance of the silver paste was measured using a Hewlett Packard 3478A Multimeter. For the resistance of the sheet, the resistance per square was calculated by moving the resistance according to the number of squares in the printed pattern. This number was 100 mm/0.5 mm=200 squares.

Adhesion: A copper clip was soldered to a fired silver paste on a glass substrate with a thickness of 3 mm. The adhesion of the clip to the silver was measured using a PS 50 kg model tensile tester made by Imada Seisakusho. The adhesion value should be greater than 20 kg.

Color: The color of glass colored by a silver paste was measured both by visual observation and by colorimeter (X-Rite Model 918). The colorimeter was designed so as to calculate the CIEL *a*b* from light reflected 45° with a beam of incident light sent through a 10° gap. The incident light was set to the 6500K spectrum of sunlight. A positive change in L or b indicates a change from a bright color to a dark color. A change in color in which L or b is 1 or greater can be detected by the unaided human eye.

EXAMPLES

Examples 1–12

A series of 12 silver-containing thick film pastes was manufactured, the compositional variability of the present invention was observed, and the compositions of the present invention were compared with ordinary (standard) thick film pastes used for the same purpose. These combinations and the fired characteristics of these pastes were shown in Tables 1 and 2. Examples 1 and 8 are examples of the present invention, and the other examples are comparative examples used to compare the present invention with patent-pending thick film paste compositions containing no metallic silver powder or glass frit. The data in these examples comprise the following.

Examples 1 through 7 involve the use of silver powder types in which the type of silver powder, the surface area/weight ratio, the particle diameter, and the CPVC were different.

In Examples 8 through 12 were used silver powders of compositions of thick film pastes whose surface area/weight ratio was 1.1 m²/g, whose particle diameter was 0.6 μm up to 1.0 μm, and the spherical CPVC was 56%, and the glass frit content was varied. Except for Examples 8 through 10, pigments of rhodium and $B_2O_3$ were added in an amount of 0.25% of the total, and their effect on the characteristics of the final paste was examined.

TABLE 1

|  | P.E. 1 | C.E. 2 | C.E. 3 | C.E. 4 | C.E. 5 | C.E. 6 | C.E. 7 |
|---|---|---|---|---|---|---|---|
| Composition |  |  |  |  |  |  |  |
| Silver powder | 80% | 80% | 80% | 80% | 80% | 80% | 80% |
| Glass powder | 0.80% | 0.80% | 0.80% | 0.80% | 0.80% | 0.80% | 0.80% |
| Organic binder | 18.95% | 18.95% | 18.95% | 18.95% | 18.95% | 18.95% | 18.95% |
| Pigment | 0.25% | 0.25% | 0.25% | 0.25% | 0.25% | 0.25% | 0.25% |
| Silver powder name | A | B | C | D | E | F | G |
| Silver powder shape | spheres | spheres | flakes | spheres | spheres | flakes | flakes |
| Specific surface area (m²/g) | 1.1 | 2.4 | 0.8 | 0.3 | 1.3 | 0.9 | 0.3 |
| Average particle diameter (micron) | 0.6 | 0.7 | 1 | 8 | 2.2 | 3.5 | 5 |
| CPVC (%) | 56 | 48 | 58 | 41 | 28 | 45 | 33 |
| Peak firing temp. (°C.) | 660 | 660 | 660 | 660 | 660 | 660 | 660 |
| Peak firing time (min.) | 3 | 3 | 3 | 3 | 3 | 3 | 3 |
| Enamel softening point (°C.) | 630 | 630 | 630 | 630 | 630 | 630 | 630 |
| Resistivity on enamel (mohm/squ. at 10 μm) | 11 | 13 | 11 | 19 | 22 | 16 | 22 |
| Film thickness (micron) | 5 | 5 | 5 | 5 | 5 | 5 | 5 |
| Adhesive strength on enamel (kg) | 25 | 8 | 10 | 7 | 5 | 6 | 5 |

[P.E.: Practical Example, C.E.: Comparative Example]

TABLE 2

|  | P.E. 8 | C.E. 9 | C.E. 10 | C.E. 11 | C.E. 12 |
|---|---|---|---|---|---|
| Composition |  |  |  |  |  |
| Silver powder | 80% | 80% | 80% | 80% | 80% |
| Glass powder | 1.00% | 0% | 2.00% | 0% | 0% |
| Organic binder | 18.95% | 18.55% | 18.95% | 18.95% | 18.95% |
| Pigment | 0% | 0% | 0% | 0.025% | 0.05% |
| Silver powder name | A | A | A | A | A |
| Silver powder shape | spheres | spheres | spheres | spheres | spheres |
| Specific surface area (m²/g) | 1.1 | 1.1 | 1.1 | 1.1 | 1.1 |
| Average particle diameter (micron) | 0.6 | 0.6 | 0.6 | 0.6 | 0.6 |
| CPVC (%) | 56 | 56 | 56 | 56 | 56 |
| Peak firing temp. (°C.) | 660 | 660 | 660 | 660 | 660 |
| Peak firing time (min.) | 3 | 3 | 3 | 3 | 3 |
| Enamel softening point (°C.) | 630 | 630 | 630 | 630 | 630 |
| Resistivity on enamel (mohm/squ. at 10 μm) | 10 | 8 | 10 | 10 | 10 |
| Film thickness (micron) | 5 | 5 | 5 | 5 | 5 |
| Adhesive strength on enamel (kg) | 26 | 20 | 11 | 15 | 10 |
| Adhesive strength on glass (kg) | 23 | 9 | 31 | 5 | 0 |

Because the automotive glass thick film conductor paste of the present invention is structured as above, when an electrically conductive grid is formed on the window of an automobile using this paste, even if the paste film is not thick, a thick film conductor paste with good adhesive strength and terminal solderability can be obtained in simultaneous firing with the enamel printed between the glass sheet and the silver.

What is claimed is:

1. A thick film paste composition for applying conductive patterns, comprising
   (a) spherical, non-coagulating fine particles of metallic silver having a surface area/weight ratio of at least 1.1 m²/g and having a particle size of 1.0 μm or less, and having a critical pigment volume concentration of at least 56%, and
   (b) fine particles of a glass frit having a softening point of 350° to 620° C. and contained in an amount of 2.1 weight parts or less per 100 weight parts of metallic silver,
   wherein (a) and (b) are dispersed in (c) an organic medium.

2. The thick film paste composition of claim 1 further comprising a coloring agent selected from the group consisting metal resinate, boron and boride compounds.

* * * * *